(12) United States Patent
Naitou et al.

(10) Patent No.: US 6,905,348 B2
(45) Date of Patent: Jun. 14, 2005

(54) CIRCUIT-CONNECTING STRUCTURE INCLUDING A TERMINAL PIECE

(75) Inventors: Tsutomu Naitou, Yokkaichi (JP); Tatsuya Oka, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/865,879

(22) Filed: Jun. 14, 2004

(65) Prior Publication Data

US 2004/0253851 A1 Dec. 16, 2004

(30) Foreign Application Priority Data

Jun. 13, 2003 (JP) ........................................ 2003-169946

(51) Int. Cl.⁷ .............................................. H01R 9/09
(52) U.S. Cl. ..................................................... 439/76.2
(58) Field of Search .......................... 439/74, 75, 76.1, 439/76.2

(56) References Cited

U.S. PATENT DOCUMENTS

| | | | |
|---|---|---|---|
| 5,357,051 A | 10/1994 | Hwang | |
| 5,554,040 A | 9/1996 | Sugiura et al. | |
| 5,655,927 A | 8/1997 | Maue et al. | |
| 5,828,543 A | 10/1998 | Leveque | |
| 6,194,656 B1 | 2/2001 | Kondo et al. | |
| 6,270,359 B1 * | 8/2001 | Kondo et al. | 439/76.2 |
| 6,761,567 B2 * | 7/2004 | Onizuka et al. | 439/76.2 |
| 6,796,808 B2 * | 9/2004 | Hosoe et al. | 439/76.2 |
| 6,796,809 B2 * | 9/2004 | Kakuta et al. | 439/76.2 |
| 2002/0009919 A1 | 1/2002 | Yamanashi et al. | |
| 2002/0124994 A1 | 9/2002 | Tanaka et al. | |

FOREIGN PATENT DOCUMENTS

| | | |
|---|---|---|
| EP | 0 929 123 | 7/1999 |
| GB | 1 223 156 | 2/1971 |
| JP | A 7-297562 | 11/1995 |

* cited by examiner

Primary Examiner—Thanh-Tam Le
(74) Attorney, Agent, or Firm—Oliff & Berridge, PLC

(57) ABSTRACT

The invention relates to a terminal piece for making connections between a first conductor element and a second conductor element superposed with a given distance. The terminal piece is formed by stamping out a substantially U-shaped piece from a conductive metal sheet and includes a first leg portion with a first contact section, a shoulder portion and a second leg portion with a second contact section, the first leg portion being longer than the second leg portion. The first conductor element includes a terminal path hole and a terminal-fixing hole. The first leg portion is passed through the terminal path hole and the first contact section is connected to the second conductor element by a first fixing device, and the second contact section is connected to the first conductor element by a second fixing device.

16 Claims, 11 Drawing Sheets

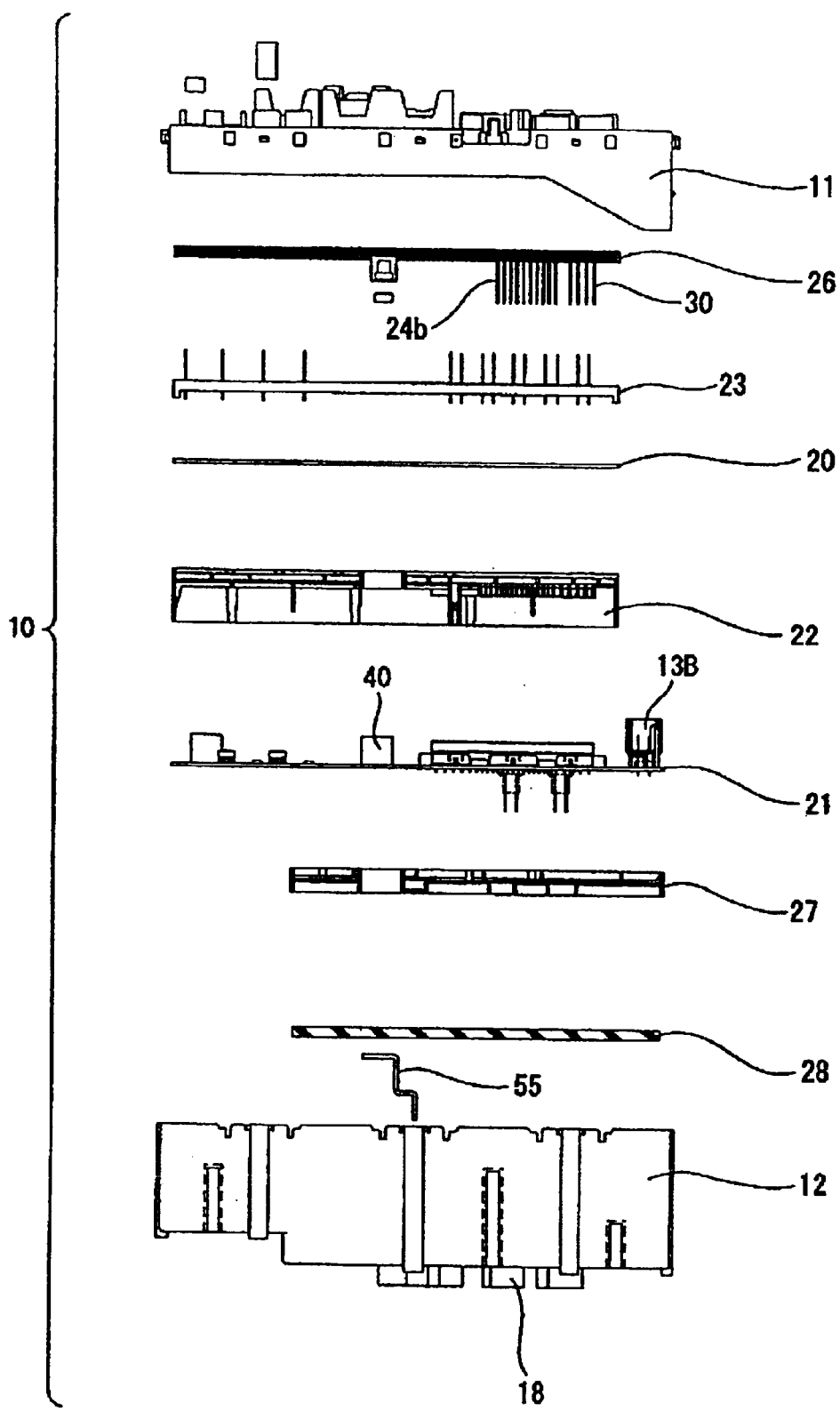

CIRCUIT-CONNECTING STRUCTURE INCLUDING A TERMINAL PIECE

CLAIM FOR PRIORITY

The present disclosure relates to subject-matter contained in and claims priority to Japanese Application No. 2003-169946, filed on Jun. 13, 2003.

BACKGROUND OF THE INVENTION

1. Field of Invention

The present invention relates to a circuit connecting structure using terminal pieces and to an electrical connector housing containing such a structure. The invention pertains in particular to a terminal piece that makes connections between conductors on different printed circuit boards, or between a conductor on a printed circuit board and a busbar, or between busbars.

2. Description of Related Art

The recent increase in the number of items of electrical equipment placed on board in vehicles has prompted manufacturers to use printed circuit boards as a circuit-making material for setting circuits in an electrical connector housing.

JP-A-7-297562 discloses an electrical connector housing 1 shown in FIG. 1, which is composed of an upper casing 2 and a lower casing 3, together with a first printed circuit board 5 and a second printed circuit board 6 between which is interposed an insulating plate 4. The first printed circuit board 5 and the second printed circuit board 6 are respectively provided with terminal-fixing holes 5a and 6a through which connector pins 7 are passed and fixed by soldering.

In such configuration, the top ends of the connecting pins 7 project upwardly from the first printed circuit board 5, whereas the bottom ends project downwardly from the second printed circuit board 6. Accordingly, the top ends of the connecting pins 7 must be soldered to the first printed circuit board 5 from the top, while their bottom ends must be soldered to the second printed circuit board 6 from the bottom, which reduces operational efficiency.

SUMMARY OF THE INVENTION

To address such a problem, an aspect of the present invention provides a terminal piece which facilitates the connections between the conductors on printed circuit boards, or between a conductor on a printed circuit board and a busbar, or between busbars.

To this end, there is provided a terminal piece for making connections at least between a first conductor element and a second conductor element at a given separation from the first conductor element.

The terminal piece may be formed as substantially U-shaped piece stamped out from a conductive metal sheet and may include a first leg portion with a first contact section, a shoulder portion and a second leg portion with a second contact section, the first leg portion being longer than the second leg portion.

The first conductor element further may include a terminal path hole and a terminal-fixing hole.

Then, the first leg portion is passed through the terminal path hole and the first contact section is connected to the second conductor element by a first fixing device. Subsequently, the second contact section is connected to the first conductor element by a second fixing device.

The first conductor element may form part of a first printed circuit board including at least a first conductor, and the second conductor element may form part of a second printed circuit board including at least a second conductor.

The terminal path hole may be provided in an area of the first printed circuit board that is not wired with the first conductor.

Alternatively, either the first conductor element may form part of a printed circuit board including at least one conductor and the second conductor element may be a busbar, or the first conductor element may be a busbar, and the second conductor element may form part of a printed circuit board including at least one conductor.

Alternatively still, the first conductor element and the second conductor element may be respective busbars.

The first fixing device may be a relay connector including a female relay terminal, such that the first contact section may be connected to the second conductor element by fitting into the female relay terminal, and the second fixing device may be a soldered joint.

Alternatively, the first and second fixing device may be respective soldered joints.

The first conductor element may include a second terminal-fixing hole through which a second terminal piece is inserted, such that the second terminal piece and the second contact section can be soldered from a same side.

Alternatively, the first conductor element may may include a second terminal-fixing hole through which a second terminal piece is inserted, such that the second terminal piece and the first and second contact sections can be soldered from a same side.

Various aspects of the invention also relate to a circuit-connecting structure including a terminal piece for making connections at least between a first conductor element and a second conductor element at a given separation from the first conductor element.

The terminal piece is formed by a substantially U-shaped piece stamped out from a conductive metal sheet and may include a first leg portion with a first contact section (31a), a shoulder portion (32) and a second leg portion with a second contact section, the first leg portion being longer than the second leg portion.

The first conductor element may include a terminal path hole and a terminal-fixing hole.

Then, the first leg portion may be passed through the terminal path hole and the first contact section may be connected to the second conductor element by a first fixing device, and the second contact section may be connected to the first conductor element by a second fixing device.

Preferably, the first and second conductor elements respectively form part of a first printed circuit board and a second printed circuit board.

Various aspects of the invention further relate to an electrical connector housing containing a circuit-connecting structure including a terminal piece for making connections at least between a first conductor element and a second conductor element at a given separation from the first conductor element, the terminal piece is formed by a substantially U-shaped piece stamped out from a conductive metal sheet and includes a first leg portion with a first contact section, a shoulder portion and a second leg portion with a second contact section, the first leg portion being longer than the second leg portion, the first conductor element includes a terminal path hole and a terminal-fixing hole, wherein the first leg portion (31) is passed through the terminal path hole and the first contact section is connected to the second conductor element by a first fixing device, and the second contact section is connected to the first conductor element by a second fixing device.

Preferably, the first and second conductor elements respectively form part of a first printed circuit board and a second printed circuit board.

Various aspects of the invention also concern a method for connecting a first conductor element to a second conductor element using a terminal piece which includes a first leg portion with a first contact section, a shoulder portion and a second leg portion with a second contact section, the method including providing a terminal path hole and a terminal-fixing hole in the first conductor element, installing the terminal piece such that the first leg portion passes through the terminal path hole of the first conductor element and reaches the second conductor element, and the second leg portion is inserted into the terminal-fixing hole in the first conductor element, whereby the second contact section is fixed to the first conductor 15 element by soldering, while the first contact section is fixed to the second conductor element by press-fitting.

The first and second conductor elements may respectively form part of a first printed circuit board and a second printed circuit board.

In the above construction, the first and second leg portions of the terminal piece protrude in the same direction, so that, when they may be to be connected to the conductor on the printed circuit board or to a busbar, they can be soldered from the same direction. This structure thus removes the complications encountered when the upper side printed circuit board and busbar have to be soldered from the top, while the lower side printed circuit board and busbar have to be soldered from the bottom. The efficiency of soldering operation can thus be improved considerably.

In the above structure, the first contact section of the first leg portion of the terminal piece can be connected to the female relay terminal (contained in the relay connector provided on the second printed circuit board) by press-fitting. The press fitting allows the terminal piece to be connected in a flexible manner compared to the soldering device, and can prevent the terminal piece from breaking when subjected to excessive loads.

The printed circuit board may include electronic devices that are connected by other terminal pieces. In this case, the terminal pieces may be installed from the same direction as for the first and second leg portions, so that all of these terminal pieces can be soldered from the same side, thus greatly facilitating the soldering operation.

In the above electrical connector housing, the conductors on the first and second printed circuit boards, a conductor on a printed circuit board and a busbar, and/or two busbars can be connected easily by using the terminal piece of aspects of the invention. The above structure thus allows the housing to be miniaturized, highly condensed and manufactured at lower costs.

BRIEF DESCRIPTION OF THE DRAWINGS

The above, and the other objects, features and advantages of aspects of the present invention will be made more apparent from the following description of the exemplary embodiments, given as non-limiting examples, with reference to the accompanying drawings, in which:

FIG. 3 is an exploded side view of the electrical connector housing of FIGS. 2A and 2B;

DETAILED DESCRIPTION OF EXEMPLARY EMBODIMENTS

Figure 1:
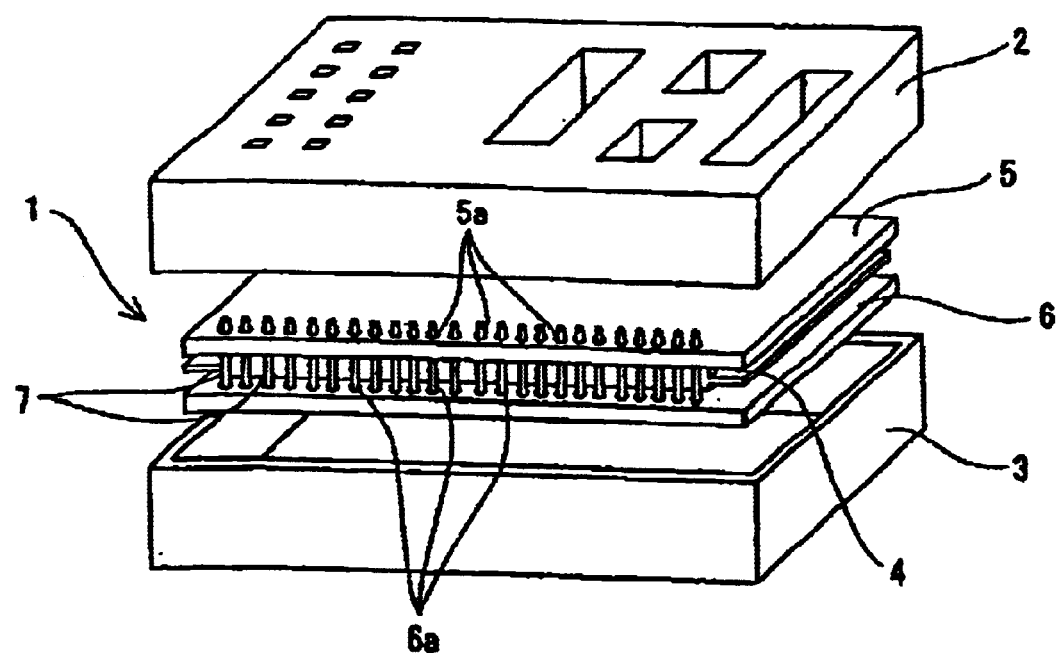
FIG. 1 is a perspective view of the internal configuration of an electrical connector housing according to related art.

FIGS. 2 to 8 show a first embodiment of the invention, in which a first (e.g., upper) casing 11 of the electrical connector housing 10 is provided with one or several connector-receiving units 13, relay-receiving units 14, fuse-receiving units 15 and fusible link-receiving units 16. A second (e.g., lower) casing 12 of the electrical connector housing 10 is provided with one or several connector-receiving units 18.

The first casing 11 includes first locking device 11a at a given position on its external face, and the second casing 12 includes second locking device 12a at a given position on its external face, so that the first and second casings 11 and 12 can be closed by cooperation of the first and second locking device.

Figure 4:
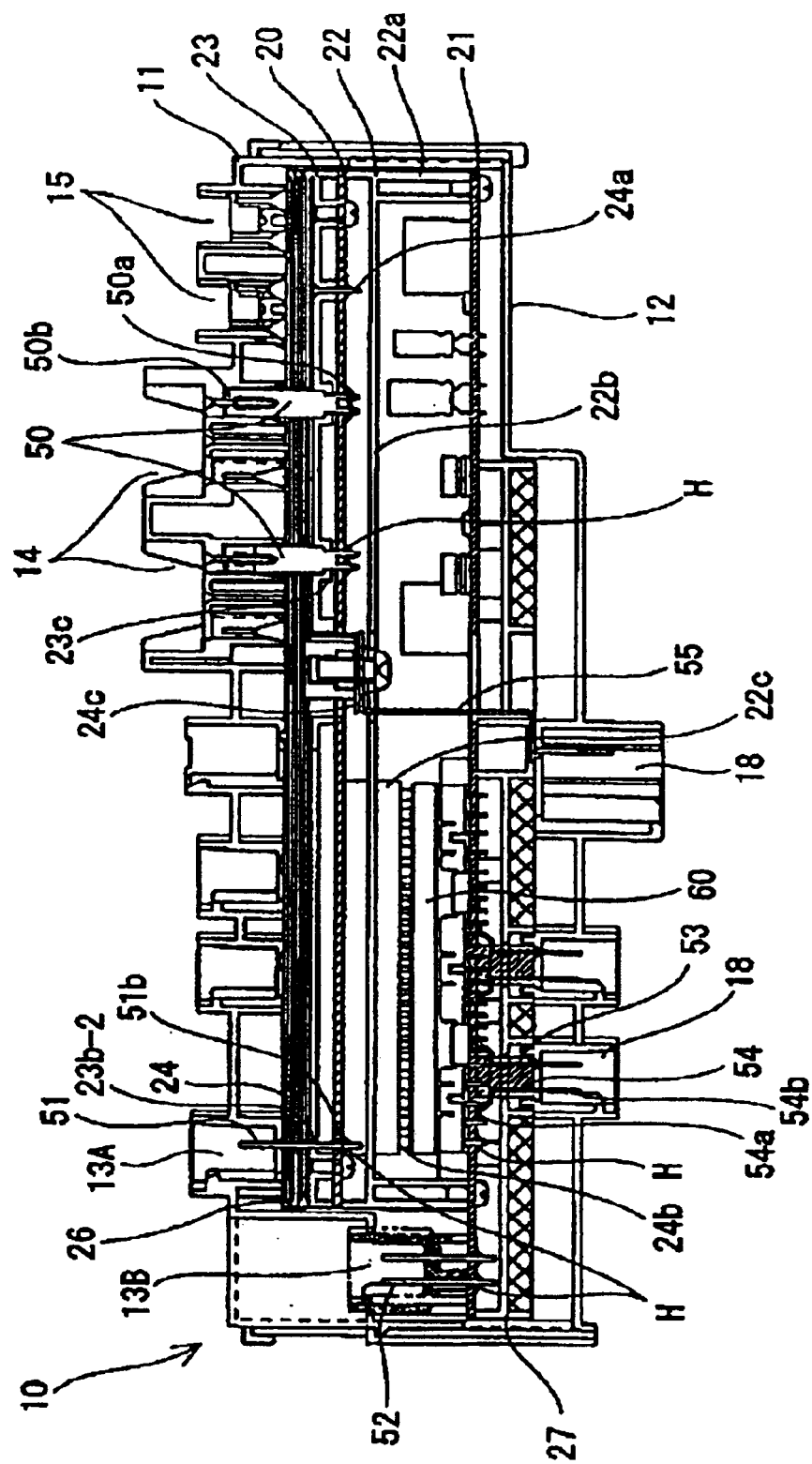
FIG. 4 is a cross-sectional side view of the electrical connector housing of FIGS. 2A and 2B.

FIG. 4 shows the inside of the housing, where the first printed circuit board 20 (upper side) and the second printed circuit board 21 (lower side) are mounted horizontally on either side of a board holder 22. A busbar laminate 26, formed by alternately laying a busbar 24 and an insulating plate 25, is arranged above the first printed circuit board 20 via a terminal-holding insulating channel 23. An anti-noise plate 27 containing a noise absorber 28 is arranged below the second printed circuit board 21.

The board holder 22 includes a web plate 22b which separates the inside space into the first casing side and the second casing side, and flanges 22a which are bound to each end of the web plate 22b and which extend perpendicularly to the latter.

Figure 5A:
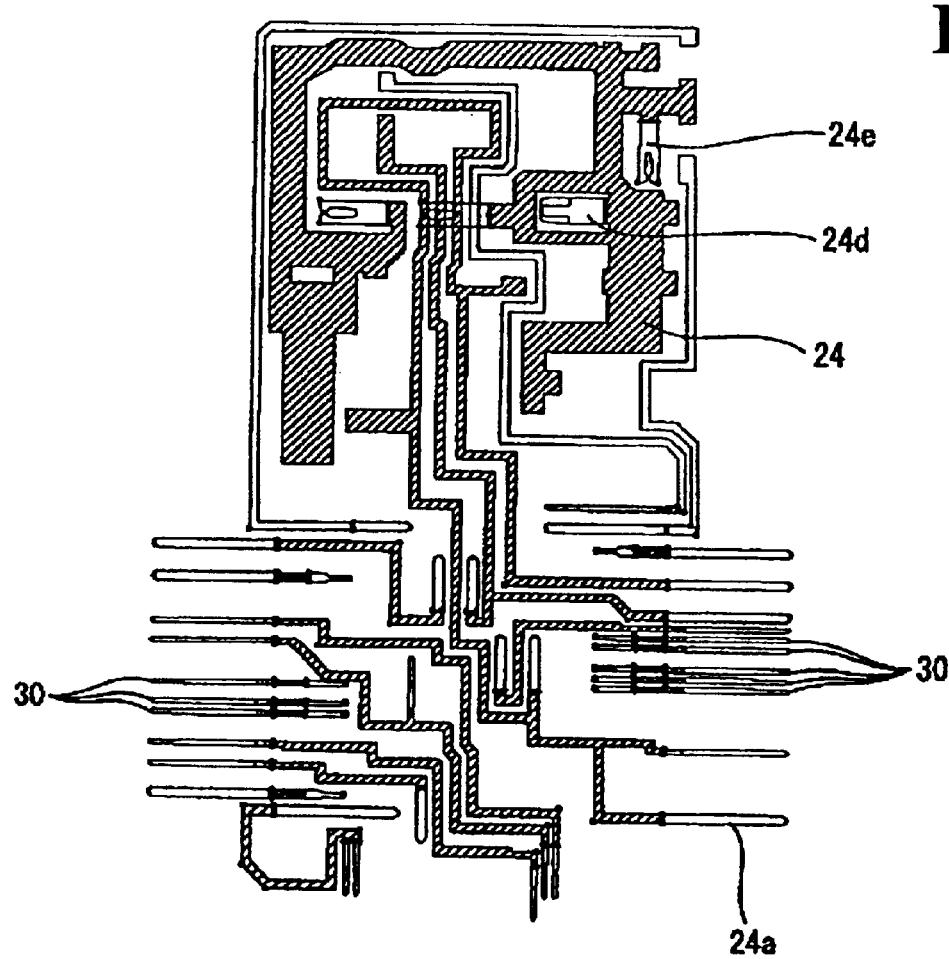
FIG. 5A is a top plan view of busbars stamped out from a conductive metal plate according to a second embodiment of the invention.
Figure 5B:
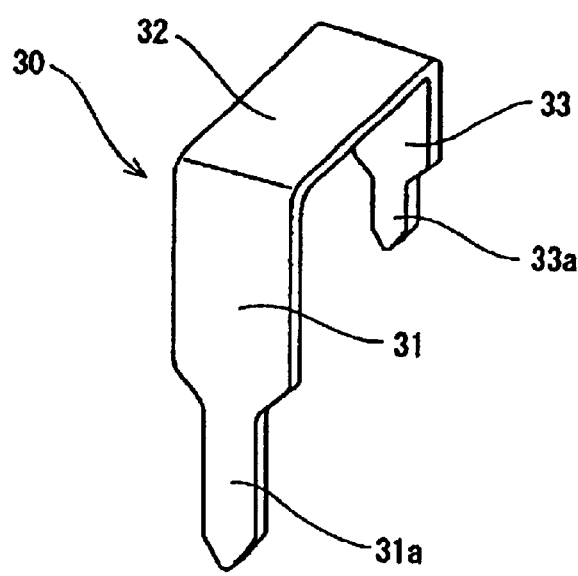
FIG. 5B is a perspective view of a terminal piece in accordance with an embodiment of the invention.
Figure 6:
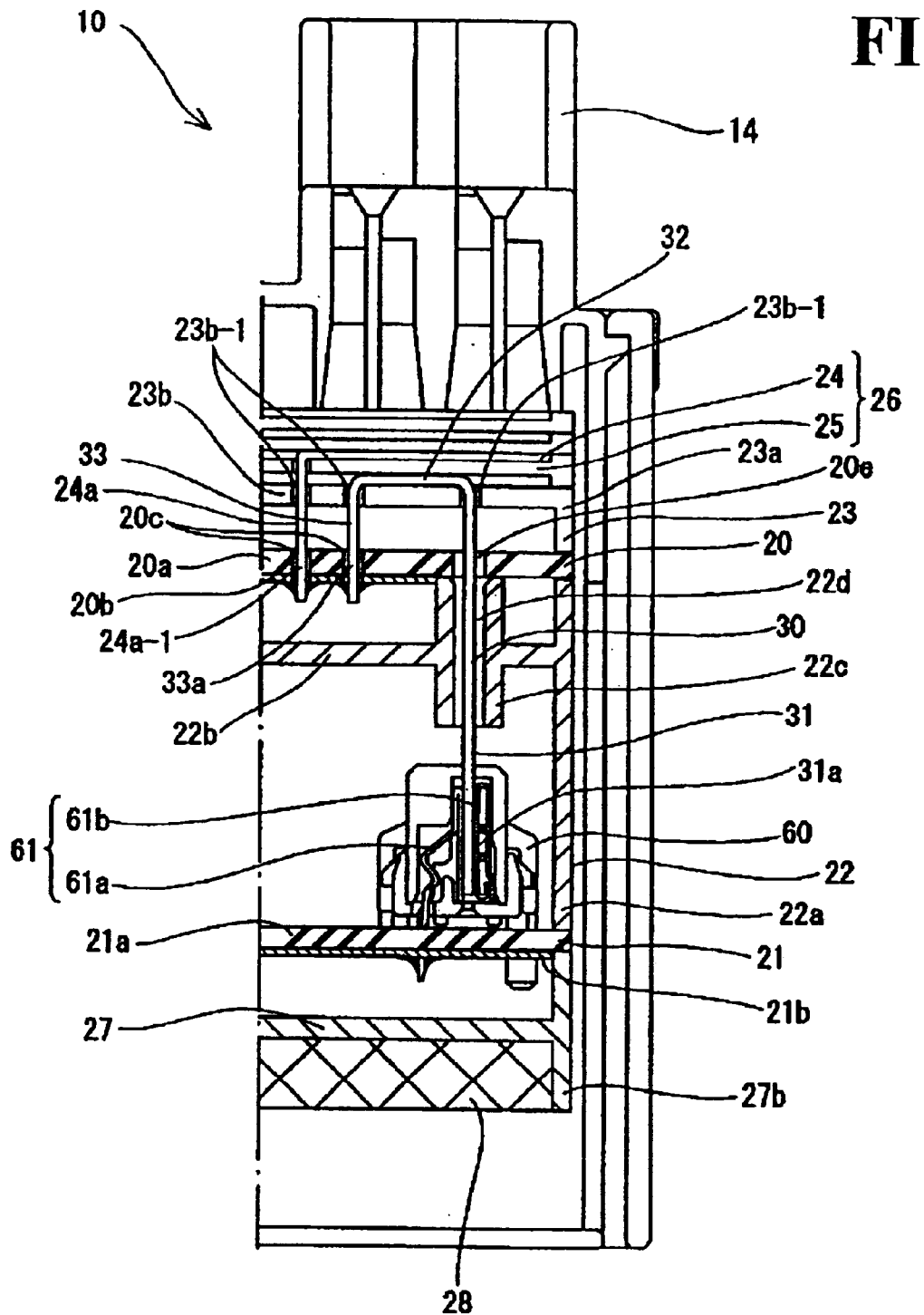
FIG. 6 is a cross-sectional side view of part of the electrical connector housing of FIGS. 2A and 2B, when the terminal piece of FIG. 5 is mounted with the printed circuit boards.

As shown in FIGS. 5B and 6, the terminal piece 30 includes a first leg portion 31 with a first end section 31a, a shoulder portion 32 and a second leg portion 33 with a second end section 33a, the first leg portion being longer than the second leg portion. The board holder 22 (see FIG. 6) further includes a terminal path portion 22c extending perpendicularly from the web plate 22b in opposing directions (upwardly and downwardly in FIG. 6). The terminal path portion 22c contains a tubular hole 22d through which the end section of the first leg portion 31 of the terminal piece 30 is passed.

Above the board holder 22 (see FIG. 6), the first printed circuit board 20 is arranged on the first (upper) end section of the flanges 22a, with its rim section fixed to the latter. Likewise, below the board holder 22, the second printed circuit board 21 is arranged on the second (lower) end section of the flanges 22a, with its rim section fixed to the latter.

As shown in FIG. 6, a first face of the first and second insulating plate 20a and 21a of the respective first and second printed circuit boards 20 and 21 is printed with conductors 20b and 21b.

The second printed circuit board 21 is further provided with a relay connector 60 that contains a female relay terminal 61. The latter includes a connecting member 61a and an elastic member 61b which together clasp the incoming terminal piece 30. The connecting member extends from near the insulating plate 21a towards the web plate 22b, and then turns back to near the insulating plate 21a.

In that return path, a middle portion of the returning member is bent several times, and the member's end section is passed through the second printed circuit board 21 and fixed to the second conductor 21b by soldering. One end section of the elastic member 61b likewise extends from near the insulating plate 21a towards the web plate 22b, then turns back to near the insulating plate 21a, and the returned end section is fixed to the relay connector 60. The other end section of the elastic member 61b is turned away from the insulating plate 21a. Such configuration of the elastic member 61b increases elasticity.

The first printed circuit board 20 is provided with a terminal-fixing hole 20c. Into this hole is inserted the second end section 33a of the second leg portion 33 of the terminal piece 30, and/or a first tab 24a formed by bending a busbar 24 toward the first printed circuit board 20. The first printed circuit board 20 is further provided with a terminal path hole 20e through which part of the first leg portion 31 of the terminal piece 30 is passed. This terminal path hole 20e is arranged to correspond to a tubular hole 22d of the terminal path portion 22c of the board holder 22.

As shown in FIG. 5A, the terminal piece 30 connecting the first conductor 20b of the first printed circuit board 20 to the second conductor 21b of the second printed circuit board 21 is stamped out from a conductive metal sheet that is also used for making the busbars 24. In other words, the terminal pieces 30 and the busbars 24 are simultaneously stamped out in line, and there is no need to prepare special dies for terminal pieces 30.

As shown in FIG. 5B, the terminal piece 30 is formed by bending the stamped out elongate sheet having the same electro-conductivity as the busbars. As mentioned above, the terminal piece 30 includes a first leg portion 31 with a first end section 31a, a shoulder portion 32 and a second leg portion 33 with a second end section 33a, the first leg portion being longer than the second leg portion. Accordingly, it has a substantially U-shaped form. The first end section 31a and the second end section 33a are made narrower, and can be inserted into the terminal-fixing holes and soldered.

As shown in FIG. 5A, the bulbar 24 may be provided with a terminal 24d for connecting to a power source, a plurality of first tabs 24a and a press-fit terminal 24e.

Above the first printed circuit board 20, there is provided a terminal-holding insulating channel 23 (FIG. 6) composed of a separating plate 23b arranged substantially parallel to the first printed circuit board 20 and sidewalls 23a extending towards it. As shown in FIG. 6, the separating plate 23b is provided with terminal path holes 23b-1 at positions corresponding to those of the terminal-fixing holes 20c, and a terminal path hole 20e formed in the first printed circuit board 20, as well as a terminal path hole 23b-2 (see FIG. 4) through which passes a substantially straight terminal 51 coming from the connector-receiving unit 13A located above. The separating plate 23b further includes a terminal holder 23c extending towards the first printed circuit board 20 (see FIG. 4). A press-fit terminal 50 having a main portion (described below) is press-fitted into this terminal holder 23c and its main portion is fixed therein.

The press-fit terminal 50 includes the above-mentioned main portion, one end of which is formed into a clasping section (e.g., clasping blades) 50b and the other end of which is formed into a bifurcated section (e.g., bifurcated pins) 50a. The bifurcated section 50a is passed through a terminal-fixing hole in the first printed circuit board 20 and fixed to the first conductor 20b by soldering, whereas the clasping section 50b is made to protrude into a relay-receiving unit 14 or fuse-receiving unit 15 provided on the first casing 11.

The substantially straight terminal 51 includes a contact section 51b, an intermediate section and a head section. The contact section 51b is passed through a terminal-fixing hole formed in the first printed circuit board 20 and fixed to the first conductor 20b by soldering, while the intermediate section is passed through the busbar laminate 26 and the head section is protruded into a connector-receiving unit 13A or fusible link receiving unit 16.

When the terminal piece 30 is used for connecting the first conductor 20b of the first printed circuit board 20 to the second conductor 21b of the second printed circuit board 21, the busbar 24 and the terminal piece 30 are first clasped by the insulating plates 25, so as to form a busbar laminate 26, in which the first tabs 24a of the busbar 24 and the first and second leg portions 31 and 33 of the terminal piece 30 extend toward the first and second printed circuit boards 20 and 21 (towards the second casing 12).

Then, the press-fit terminal 50 and the substantially straight terminal 51 are pressed into the terminal-holding insulating plate 23, to which the first printed circuit board 20 is fixed from the side of the second casing 12 by a stopper and screw arrangement (not shown in the figures). This assembly is then mounted onto the busbar laminate 26 from the side of the second casing 12, such that the first leg portion 31 of the terminal piece 30 passes through the first terminal path hole 23b-1 of the terminal-holding insulating plate 23 (right hand side in FIG. 6) and the terminal path hole 20e of the first printed circuit board 20.

Coincidentally, the second leg portion 33 of the terminal piece 30 passes through the second terminal path hole 23b-1 of the terminal-holding insulating plate 23 (central position in the FIG. 6), and the first terminal-fixing hole 20c in the first printed circuit board 20. The first tab 24a of the busbar 24 passes through a third terminal path hole 23b-1 of the of the terminal-holding insulating plate 23 (left-hand sick in the FIG. 6) and the second terminal-fixing hole 20c in the first printed circuit board 20.

Then, the contact section 33a of the second leg portion 33 of terminal piece 30, the contact section 24a-1 of the first tab 24a of busbar 24, the bifurcated section 50a of the press-fit terminal 50 and the contact section 51b of the substantially straight terminal 51 are fixed to the first conductor 20b of the first printed circuit board 20 by soldering. As the four contact sections extend from the first printed circuit board 20 in the same direction, sequential or simultaneous soldering can be performed, and work efficiency is improved.

The shoulder portion 32 of the terminal piece 30 bridges two 10 terminal path holes 23b-1 and is held between the terminal-holding insulating plate 23 and the busbar laminate 26.

Subsequently, the board holder 22 is fixed to the second face (underside in FIG. 6) of the first printed circuit board 20 by a stopper and screw arrangement, such that the first leg portion 31 of the terminal piece 30 passes through the tubular hole 22d of the terminal path portion 22c, integrally formed with board holder 22.

Finally, the second printed circuit board 21, fixed with a relay connector 60 beforehand by screwing, is fixed to the underside (viewed in FIG. 6) of the board holder 23 by a stopper and screw arrangement (not shown in the figure), such that the first leg portion 31 of the terminal piece 30 passes through the relay connector 60 and is placed into contact with the female relay terminal 61 soldered with the second conductor 21b on the second face of the second printed circuit board 21. The first conductor 20b of the first printed circuit board 20 is thus electrically connected to the second conductor 21b of the second printed circuit board 21.

Figure 2A:
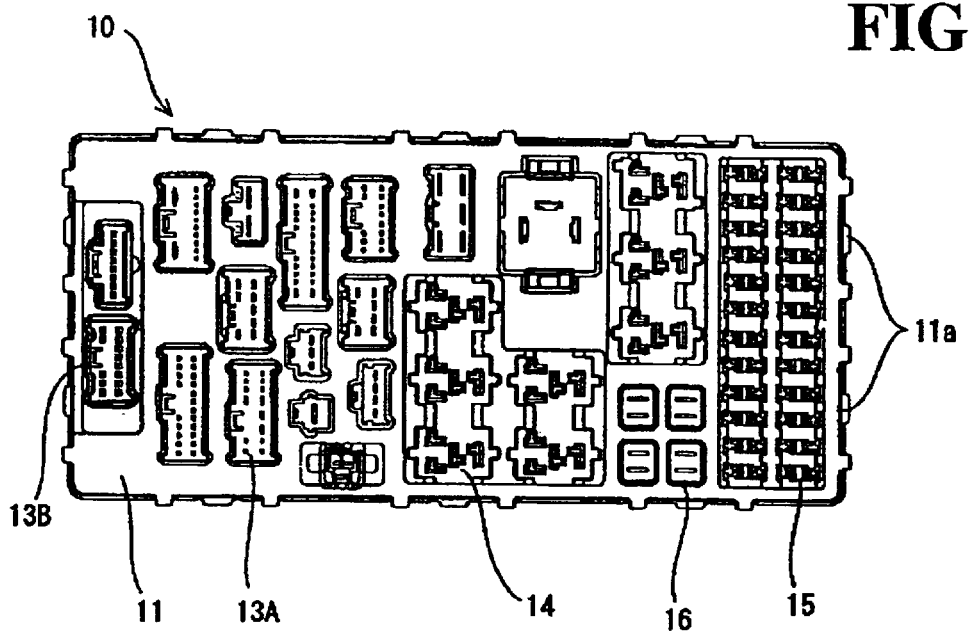
FIG. 2A is a top plan view of an electrical connector housing according to a first embodiment of the invention.
Figure 2B:
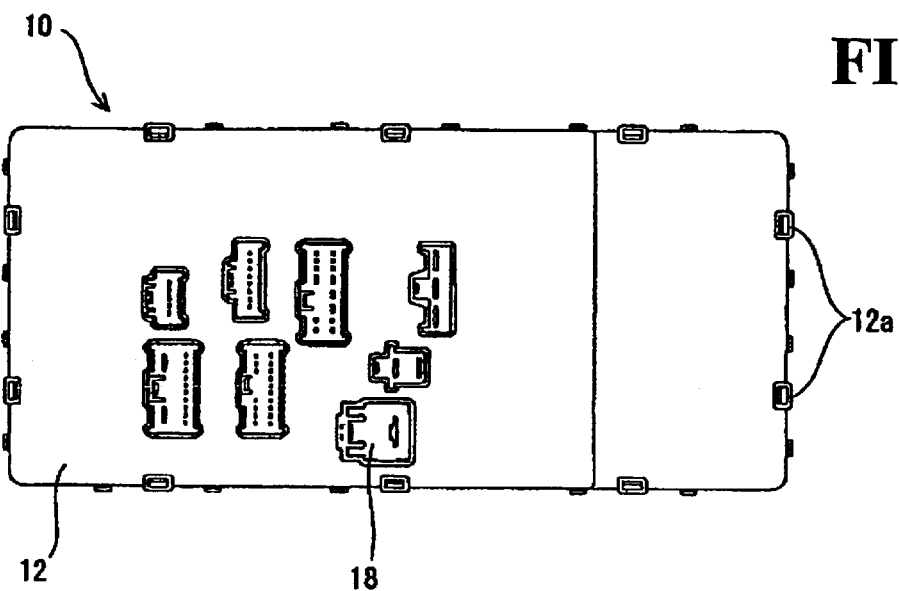
FIG. 2B is a top plan view of the electrical connector housing of FIG. 2A, seen from the opposite side.

As shown in FIGS. 2A and 4, the first face of the second printed circuit board 21 is provided with a PCB connector housing 13B by screwing at a first end portion of this first face. The PCB connector housing 13B contains a terminal 52 that is connected to the second conductor 21b on the second printed circuit board 21 and projects in the housing 13B. The PCB connector housing 13B is arranged on the second printed circuit board 21 and positioned outside the board holder 22.

Second tabs 24b are formed by bending the corresponding busbars 24 towards the second printed circuit board 21. These tabs 24b pass through the terminal path holes formed in the first printed circuit board 20 and reach the second printed circuit board 21 via the relay connector 60. These tabs 24b are then fixed to the second conductor 21b of the second printed circuit board 21.

Further, a terminal-holding block 53 is placed at the side of the second face (underside in FIG. 4) of the second printed circuit board 21. This block 53 contains one or several terminals 54 made by molding or fixed by press-fitting. Each terminal 54 includes a first end 54a and a second end 54b. The first end 54a of the terminal 54 protrudes towards the second printed circuit board 21 and is fixed on the second conductor 21b of the second face thereof by soldering.

The terminal-holding block 53 is installed through a terminal path hole 27a (see FIGS. 7A, 7B and 7C) provided in the noise-absorbing plate 27. The second end 54b of the terminal 54 protrudes into the connector-receiving unit 18 formed on the second casing 12, so as to be connected with an external connector.

As can be seen in FIG. 4, the busbar laminate 26 is installed on the first face of the first printed circuit board 20 via the terminal-holding insulating plate 23, and the tab 24c extends towards the second casing 12 from that busbar 24 of the laminate 26, which is placed proximal to the first printed circuit board 20. The tab 24c extends by passing near a portion that is notched in the peripheral rim of the terminal-holding insulating plate 23 and the first printed circuit board 20, towards the second face of the first printed circuit board 20, in the proximity to which the tab 24c is fixed to an electric power busbar 55 by a bolt. The electric power busbar 55 extends by passing near a portion notched in the peripheral rim of the board holder 22, second printed circuit board 21, noise-absorbing plate 27, and protrudes into the connector-receiving unit 18 on the second casing 12. The electric power busbar 55 can thus be connected to a connector which leads to a wire harness.

As shown in FIG. 3, the first face of the second printed circuit board 21 is provided with a plurality of electronic devices 40.

Figure 7A:
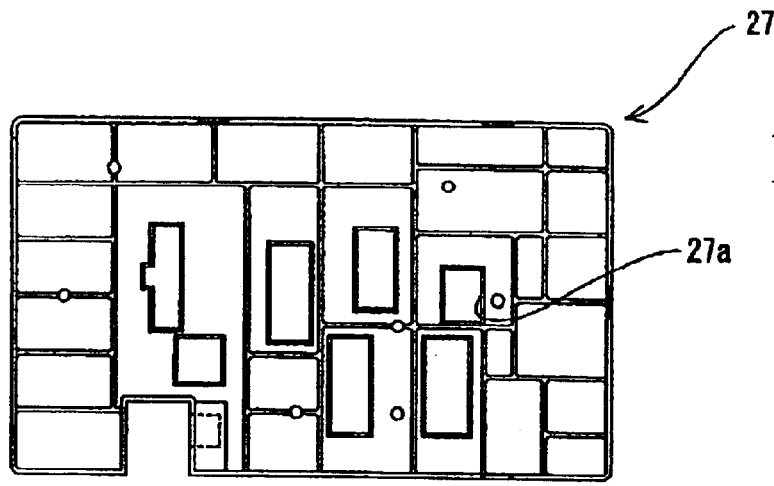
FIG. 7A is top plan view of a noise-absorbing plate according to a second embodiment of the invention.
Figure 7B:
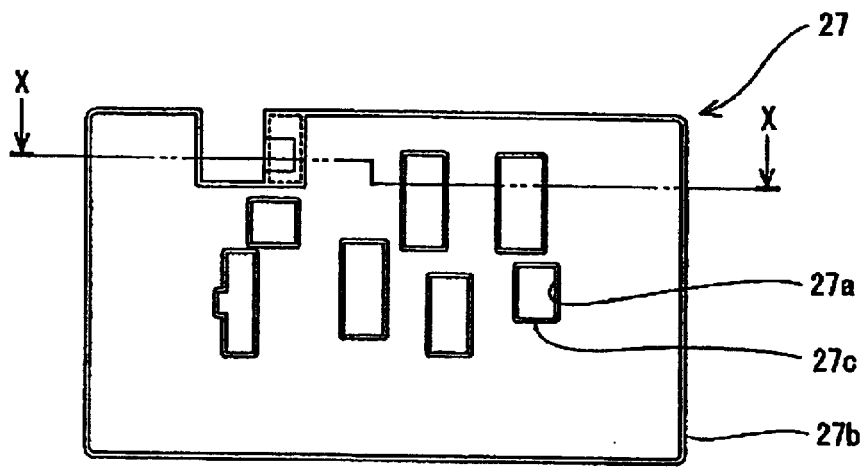
FIG. 7B is top plan view of the noise-absorbing plate of FIG. 7A, seen from the opposite side.
Figure 7C:
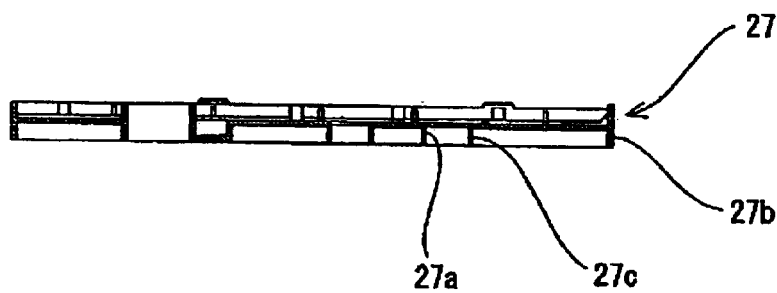
FIG. 7C is a side view of the noise-absorbing plate of FIGS. 7A and 7B, when viewed along the cross-sectional plane X—X of FIG. 7B.

Further, as shown in FIGS. 7A to 7C, the noise-absorbing plate 27 has a substantially rectangular shape and is arranged near the second face of the second printed circuit board 21 (FIG. 4). The noise-absorbing plate 27 is provided with terminal path holes 27a through which the terminals extend in the direction going from the first casing 11 to the second casing 12. A rib 27b is provided along the edge of the noise-absorbing plate 27. Likewise, ribs 27c are provided along the edge of the terminal path holes 27a.

Figure 8A:
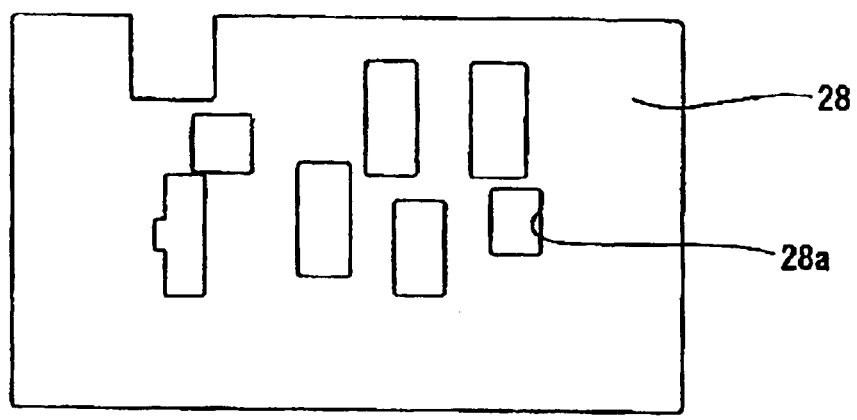
FIG. 8A is a top plan view of a noise absorber when viewed from underside in the electrical connector housing according to a second embodiment of the invention.
Figure 8B:
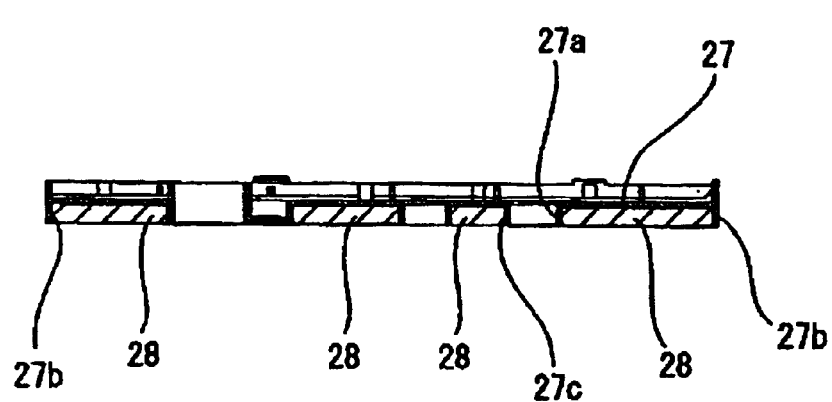
FIG. 8B is a side view of the noise absorber, when mounted onto the noise-absorbing plate according to a second embodiment of the invention.

The noise-absorber 28 is made of a non-woven fabric or cloth and formed into a given thickness. As shown in FIG. 8A and 8B, the noise-absorber 28 is provided with holes 28a at positions corresponding to those of terminal path holes 27a in the noise-absorbing plate 27, and contained inside the rib 27b around the edge of noise-absorbing plate 27.

The noise absorber 28 in the present embodiment includes a non-textured cloth such as very fine polypropylene or polyester fibers, or a mixture of such fibers.

In the above structure, the first conductor 20b of the first printed circuit board 20 and the second conductor 21b of the second printed circuit board 21 can be connected merely by fitting the contact section 33a of the second leg portion 33 of terminal piece 30 to the first terminal-fixing hole 20c in the first printed circuit board 20 and soldering it thereto, and fitting the contact section 31a of the first leg portion 31 to the female relay terminal 61 in the relay connector 60 on the second printed circuit board 21.

Moreover, since the contact section 31a of the first leg portion 31 of terminal piece 30 is merely fitted into the female relay terminal 61 in the relay connector 60, the connection of terminal piece 30 is placed in a flexible state, compared to the soldering. For instance, even when the terminal piece 30 receives excessive loads, break of it can be avoided.

Further, the tab 24a formed by bending the busbar 24, the press-fit terminal 50 to be soldered to the first printed circuit board 20, the substantially straight terminals 51 and the terminal pieces 30 for connecting the first printed circuit board 20 to the second printed circuit board 21 are all protruded onto the second face of the first printed circuit board 20, so that they can be connected to the first conductor 20b on the first printed circuit board 20 by soldering in series or simultaneously from the same side, so greatly facilitating the connecting operation.

Alternatively, the contact section of the terminal piece 30 can be made into a press-fit structure, and fitted into the terminal-fixing hole in the first and second printed circuit boards 20 and 21 for connection, and optionally further soldered for final fixing.

Figure 9:
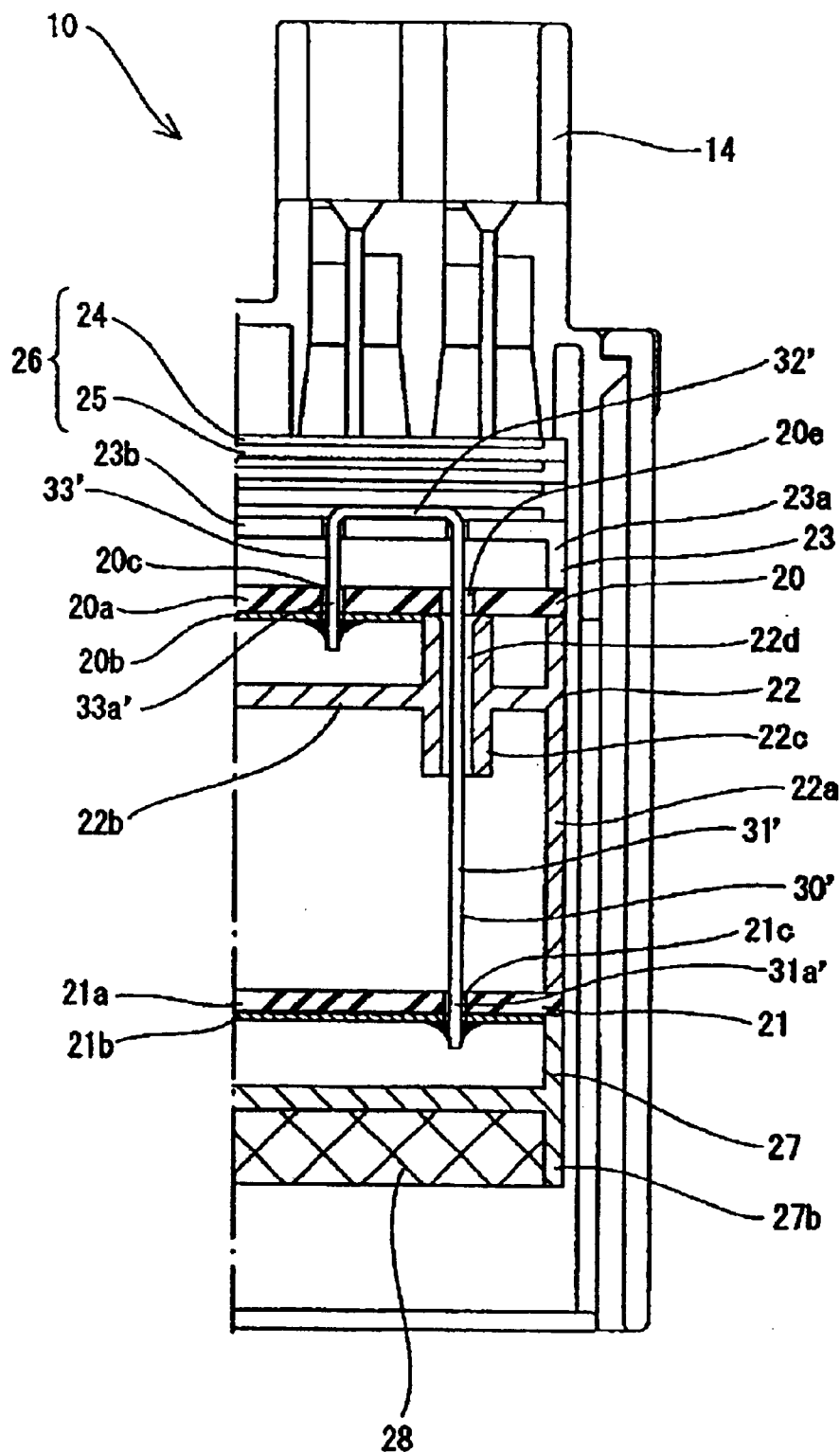
FIG. 9 is a cross-sectional side view of part of the electrical connector housing of FIGS. 2A and 2B, when a terminal piece according to a second embodiment is mounted with the printed circuit boards.

FIG. 9 shows a second embodiment of the present invention, in which the first and second printed circuit boards 20 and 21 are provided with corresponding first and second conductors 20b and 21b, insulating sheets 20a and 21a and terminal-fixing holes 20c and 21c formed therein.

The connection between the first and second conductors 20b and 21b is made by a terminal piece 30' as in the case of the first embodiment. For instance, a second contact section 33a' of a second leg portion 33' is passed through the terminal-fixing hole 20c in the first printed circuit board 20, and soldered to the first conductor 20b provided on the second face of the first printed circuit board 20, so that the first and second conductors 20b and 21b of the respective first and second printed circuit boards 20 and 21 are electrically connected.

The constructions and functions of the other parts are as described for the first embodiment using corresponding references.

Figure 10:
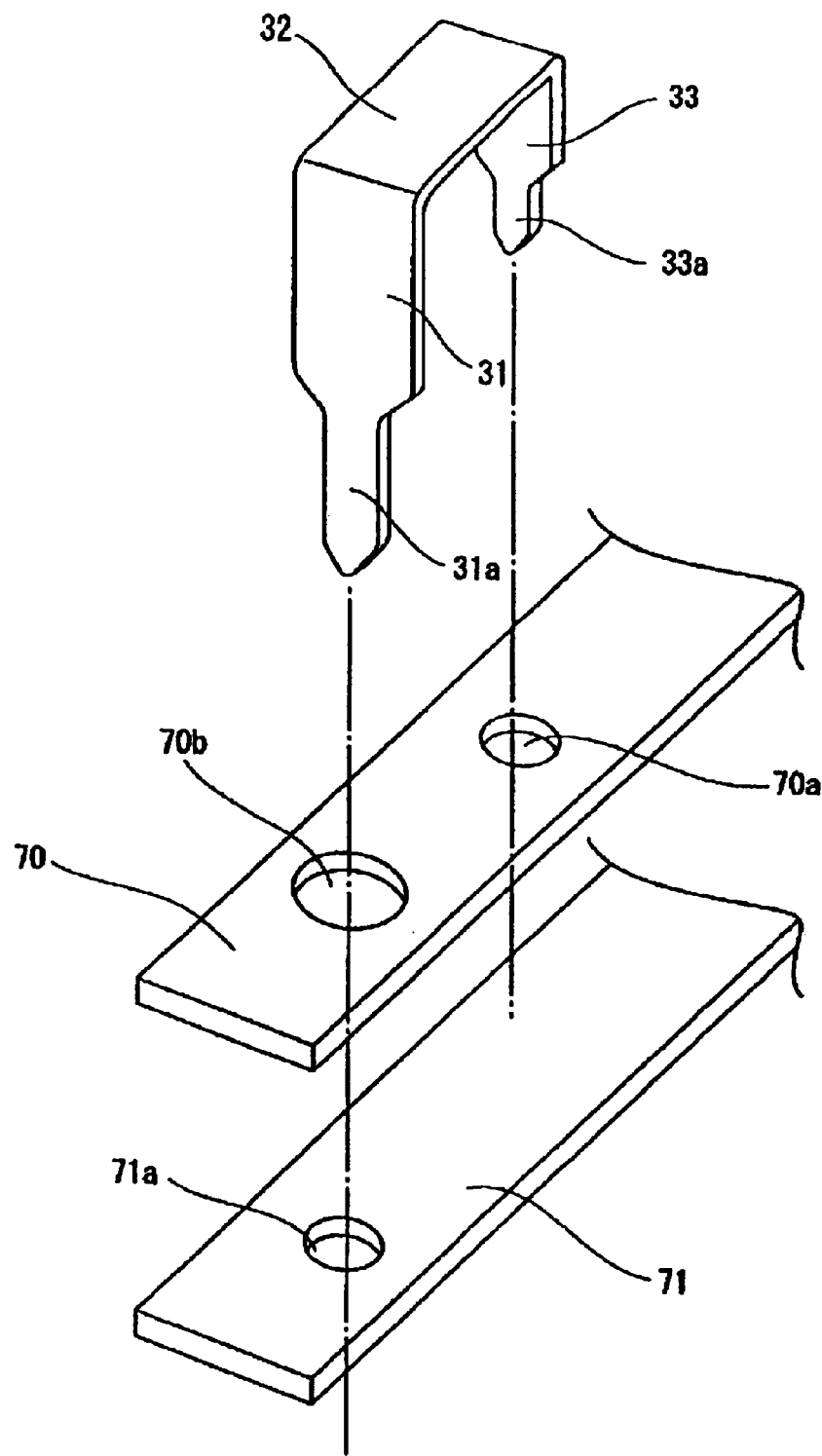
FIG. 10 is a perspective view of a terminal piece according to a third embodiment of the invention, when it is being mounted between the two busbars.

FIG. 10 shows a third embodiment of the present invention, in which a terminal piece 30 as described for the first embodiment is used for connecting the busbars.

In other words, a first busbar 70 (upper side in FIG. 10) is provided with a terminal-fixing hole 70a into which is inserted the second contact section 33a of the second leg portion 33 of terminal piece 30, and also provided with a terminal path hole 70b through which is passed the first leg portion 31. Also, a second busbar 71 (underside in FIG. 10) is provided with a terminal-fixing hole 71a into which is inserted the contact section 31a of the first leg portion 31 of terminal piece 30.

In such a structure, the first and second busbars 70 and 71 arranged in a superposed state can be connected easily using a terminal piece 30.

Figure 11:
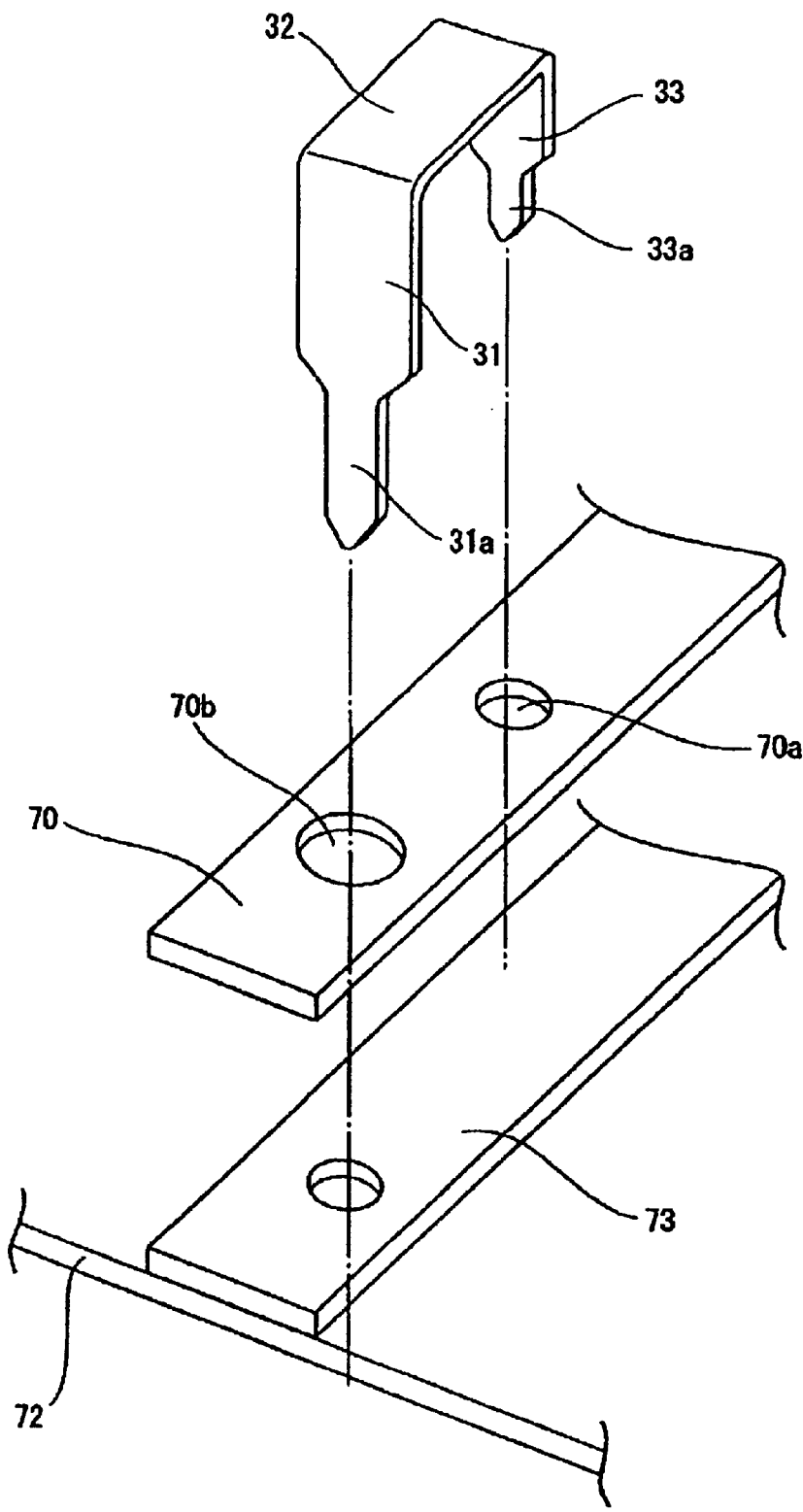
FIG. 11 is a perspective view of a terminal piece according to a third embodiment of the invention, when it is being mounted between a conductor on a printed circuit board and a busbar.

Further, as shown in FIG. 11, one of the first and second busbars 70 and 71 may be replaced by a printed circuit board 72 including a conductor 73, and the latter may be connected to the other busbar.

As can be understood from the foregoing, the first and second leg portions of the terminal piece of the invention can be mounted into the conductors of the printed circuit boards and/or the busbars, so as to protrude in the same direction, whereby both leg portions can be soldered to the conductors and/or busbars from the same side. The operational efficiency for soldering can thus be improved greatly.

Other kinds of connecting terminals e.g., for connecting a printed circuit board to a busbar, or a busbar to another busbar can also be configured such to protrude in the same direction. Thus, a flow soldering (e.g., sequential or simultaneous soldering) is rendered possible and working efficiency can be improved considerably.

In the embodiments described, two printed circuit boards are arranged in a vertically juxtaposed position with a given space therebetween. A conductor on the first printed circuit board (e.g., upper board) is provided with a terminal-fixing hole, through which a second (shorter) leg portion is passed and soldered to the conductor, so that an electrical connection is established.

The second printed circuit board (e.g., lower board) is provided with a conductor and relay device containing a female relay terminal. For electrical connections, the contact section of the first (longer) leg portion of the terminal piece is fitted into the female relay terminal. The connections by fitting the terminal piece are thus more flexible that those by soldering. Accordingly, even under excessive loads, breakage of the terminal piece can be avoided.

Furthermore, when an electrical connector housing contains printed circuit boards and/or busbars connected by such a terminal piece, the connections between the conductors of different printed circuit boards, between a conductor of a printed circuit board and a busbar and/or between different busbars can be established easily by using such a terminal piece. The configuration according to the invention thus contributes to the miniaturization, high density construction and manufacturing-cost cutting of the electrical connector housing.

Although the invention has been described with reference to particular means, materials and embodiments, it is to be understood that the invention is not limited to the particulars disclosed and extends to all equivalents within the scope of the claims. It is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

The present disclosure relates to subject matter contained in priority Japanese Application No. 2003-169946, filed on Jun. 13, 2003, which is herein expressly reference in its entirety.

What is claimed is:

1. A connector, comprising:

a terminal piece;

a first conductor element, and a second conductor element, the terminal piece connecting at least between the first and second conductor elements, the second conductor element being at a given separation from the first conductor element; the terminal piece being formed as substantially U-shaped piece stamped out from a conductive metal sheet and comprising:

a first leg portion with a first contact section, a shoulder portion, and a second leg portion with a second contact section, the first leg portion being longer than the second leg portion;

the first conductor element comprising:

a terminal path hole and a terminal-fixing hole; wherein the first leg portion is passed through the terminal path hole, and the first contact section is connected to the second conductor element by a first fixing device, and the second contact section is connected to the first conductor element by a second fixing device.

2. The terminal piece according to claim 1, wherein the first conductor element further includes a first printed circuit board comprising at least a first conductor, and the second conductor element further includes a second printed circuit board comprising at least a second conductor.

3. The terminal piece according to claim 2, wherein the terminal path hole is provided in an area of the first printed circuit board that is not wired with the first conductor.

4. The terminal piece according to claim 1, wherein
the first conductor element further includes a printed circuit board comprising at least one conductor, and
the second conductor element is a busbar.

5. The terminal piece according to claim 1, wherein
the first conductor element is a busbar, and
the second conductor element further includes a printed circuit board comprising at least one conductor.

6. The terminal piece according to claim 1, wherein the first conductor element and the second conductor element are respective busbars.

7. The terminal piece according to claim 1, wherein
the first fixing device is a relay connector including a female relay terminal, such that the first contact section is connected to the second conductor element by fitting into the female relay terminal, and
the second fixing device is a soldered joint.

8. The terminal piece according to claim 1, wherein the first and second fixing device are respective soldered joints.

9. The terminal piece according to claim 7, wherein
the first conductor element comprises a second terminal-fixing hole through which a second terminal piece is inserted, such that the second terminal piece, and
the second contact section can be soldered from a same side.

10. The terminal piece according to claim 8, wherein
the first conductor element comprises a second terminal-fixing hole through which a second terminal piece is inserted, such that the second terminal piece, and
the first and second contact sections can be soldered from a same side.

11. A circuit-connecting structure comprising:
a terminal piece for making connections at least between a first conductor element, and
a second conductor element at a given separation from the first conductor element;
the terminal piece being formed by a substantially U-shaped piece stamped out from a conductive metal sheet and comprising:
a first leg portion with a first contact section,
a shoulder portion, and
a second leg portion with a second contact section, the first leg portion being longer than the second leg portion;
the first conductor element comprising:
a terminal path hole, and
a terminal-fixing hole; wherein
the first leg portion is passed through the terminal path hole, and
the first contact section is connected to the second conductor element by a first fixing device, and
the second contact section is connected to the first conductor element by a second fixing device.

12. A circuit-connecting structure according to claim 11, wherein the first and second conductor elements respectively form part of a first printed circuit board and a second printed circuit board.

13. An electrical connector housing containing a circuit-connecting structure comprising:
a terminal piece for connecting at least between a first conductor element and a second conductor element at a given separation from the first conductor element;
the terminal piece being formed by a substantially U-shaped piece stamped out from a conductive metal sheet and comprising:
a first leg portion with a first contact section,
a shoulder portion, and
a second leg portion with a second contact section, the first leg portion being longer than the second leg portion;
the first conductor element comprising:
a terminal path hole, and
a terminal-fixing hole; wherein
the first leg portion is passed through the terminal path hole,
the first contact section is connected to the second conductor element by a first fixing device, and
the second contact section is connected to the first conductor element by a second fixing device.

14. The electrical connector housing according to claim 13, wherein the first and second conductor elements respectively form part of a first printed circuit board and a second printed circuit board.

15. A method for connecting a first conductor element to a second conductor element using a terminal piece which comprises a first leg portion with a first contact section, a shoulder portion and a second leg portion with a second contact section, the method comprising:
providing a terminal path hole and a terminal-fixing hole in the first conductor element;
installing the terminal piece, wherein the first leg portion passes through the terminal path hole of the first conductor element and reaches the second conductor element, and the second leg portion is inserted into the terminal-fixing hole in the first conductor element;
whereby the second contact section is fixed to the first conductor element by soldering, while the first contact section is fixed to the second conductor element by press-fitting.

16. The method according to claim 15, wherein the first and second conductor elements respectively form part of a first printed circuit board and a second printed circuit board.

* * * * *